United States Patent [19]

Horvat et al.

[11] Patent Number: 4,596,955

[45] Date of Patent: Jun. 24, 1986

[54] PHASE-LOCKED LOOP AND DEVICE FOR DEMODULATING FREQUENCY MODULATED SIGNALS, COMPRISING SUCH A LOOP

[75] Inventors: Philippe N. Horvat, Louviers; Joël P. Gris, Poses, both of France

[73] Assignee: U.S. Philips Corporation, New York, N.Y.

[21] Appl. No.: 604,716

[22] Filed: Apr. 27, 1984

[30] Foreign Application Priority Data

May 6, 1983 [FR] France ................... 83 07586

[51] Int. Cl.⁴ ............................................. H03D 3/00
[52] U.S. Cl. ..................................... 329/122; 329/50; 329/103; 331/8; 331/117 FE
[58] Field of Search .................. 329/50, 103, 122; 331/8, 117 FE; 455/214, 318, 319, 320

[56] References Cited

U.S. PATENT DOCUMENTS 3,723,905  3/1973  Sterner et al. ........... 331/117 FE X
4,479,091 10/1984  Yoshisato .............................. 329/122

*Primary Examiner*—Eugene R. LaRoche
*Assistant Examiner*—James C. Lee
*Attorney, Agent, or Firm*—Thomas A. Briody; William J. Streeter; Edward W. Goodman

[57] ABSTRACT

Phase-locked loop, comprising Hartley-type oscillator being formed with a dual-gate field effect transistor (10), whose gates ($G_2$) and ($G_1$) constitute the phase-comparison inputs of the loop and whose drain is coupled, optionally via a low-pass loop filter (35), to the input of the feedback circuit, this feedback circuit being connected to the tuning circuit of the oscillator.

6 Claims, 4 Drawing Figures

PHASE-LOCKED LOOP AND DEVICE FOR DEMODULATING FREQUENCY MODULATED SIGNALS, COMPRISING SUCH A LOOP

BACKGROUND OF THE INVENTION

The invention relates to a phase-locked loop, and also to the use of such a loop for demodulating frequency-modulated signals.

Television signals, which in the years to come will be transmitted via geostationary satellites, will be frequency-modulated, with significant nominal deviations of the carrier frequency of the order of 13.5 MHz. The corresponding individual and community receiving equipment will consequently be provided with devices for demodulating frequency-modulated signals, which for consumer products must be cheap and consequently of a simple construction.

SUMMARY OF THE INVENTION

To this effect the invention relates to a phase-locked loop which is characterized in that the loop comprises an oscillator of the Hartley type having a dual-gate field effect transistor whose gates constitute the phase-comparison inputs and whose drain is coupled, optionally via a low-pass loop filter, to the input of a feedback circuit, which feedback circuit is connected to the tuning circuit of the oscillator. If the phase-locked loop is used for demodulating frequency modulated signals, one of the gates receives the carrier to be demodulated and the other gate receives the oscillator signal whereas the drain is not only coupled to the input of the feedback circuit but also to the connection which constitutes the output of the demodulator circuit.

The structure thus proposed, which employs only one active element, combines in a simple way all the functions of a conventional phase-locked loop, as this active element not only functions as an oscillator transistor but also as a mixer for mixing the two gate input signals, for regenerating, at the drain, a phase-error signal which is negatively fed back through the feedback circuit to the tuning circuit of the oscillator. The main advantage of such a combination of functions is that the structure can be used at a very high frequency while the connections can be very short.

DESCRIPTION OF THE DRAWING

Particulars and advantages of the invention will now be described in greater detail, by way of non-limitative example, with reference to the accompanying drawing, in which.

DESCRIPTION OF THE PREFERRED EMBODIMENT

Figure 1:
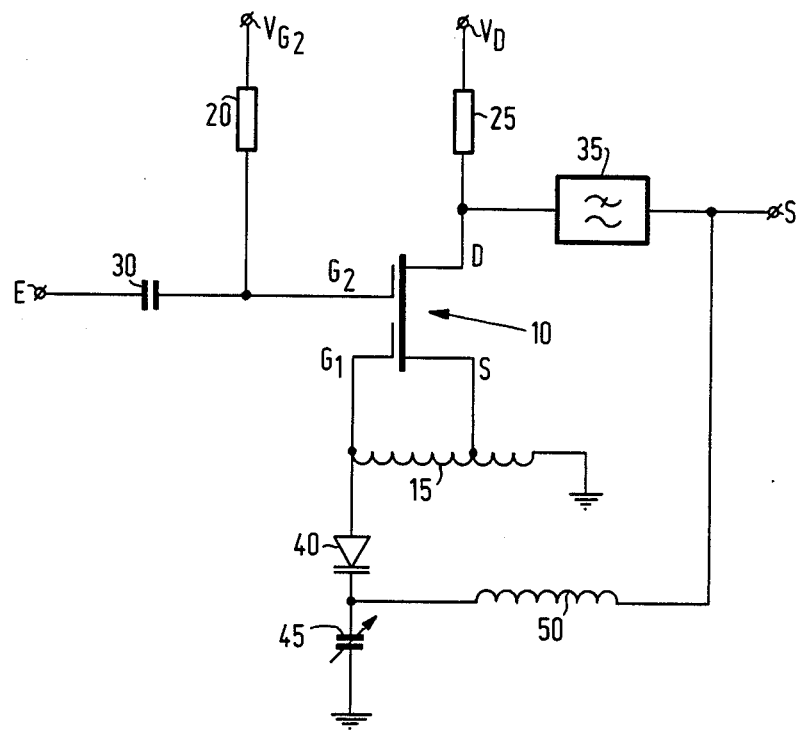
FIG. 1 shows an example of a demodulating device using a phase-locked loop according to the invention.

The device described with reference to FIG. 1 comprises a common drain connected dual-gate field effect transistor 10 arranged as a Hartley-type fedback oscillator being provided with grounded inductance 15, which is connected to a first gate $G_1$, a tapping point of this inductance 15 being connected to the source S of the field-effect transistor 10. The first gate $G_1$ and the source S are consequently biased by their connection to ground via the inductance 15, while a second gate $G_2$ of the transistor 10 is biased from a voltage $V_{G_2}$ via a resistor 20 and the drain D is biased from a voltage $V_D$ via a resistor 25.

Gate $G_2$ receives the carrier to be demodulated from terminal E via a series capacitor 30, and gate $G_1$ receives the oscillator signal while the drain D is coupled via a low-pass loop filter 35 to the output S of the device and through a feedback circuit being formed by an inductance 50 to the input of a tuning circuit 40, 45, this output S supplying the demodulated signals. The low-pass loop filter 35 is intended, on the other hand, to prevent the incoming signals at gate $G_2$ from being present also on the output S and, on the other hand, to prevent damping of the tuning circuit 40, 45. In the example described, the tuning circuit of the oscillator comprises, arranged between the gate $G_1$ and ground, a series arrangement of a varicap diode 40 (anode connected to $G_1$) and a variable capacitor 45 for varying the central oscillator frequency (or a series arrangement of first the capacitor 45 and thereafter the diode 40, the anode of this diode 40 then being connected to ground) and the feedback circuit comprises an inductance 50 through which the output signal of the device is fed back to the common connection of the diode 40 and the capacitor 45 of the tuning circuit.

The embodiment just described operates as follows. The single active element of this embodiment, the transistor 10, which combines all the functions of a phase-locked loop, first realizes a phase comparison between the signal present at the gate $G_2$ (the carrier to be demodulated) and the local oscillator signal, applied to the gate $G_1$, These respective incident and feedback signals induce, after having been amplified, the appearance on the drain D of a phase-error signal which, after being passed through filter 35, is fed back to the tuning circuit to provide negative phase feedback for the loop.

The performances of such a device are extremely satisfactory. With the demodulation device thus implemented, the center frequency being 440 MHz and the level of the incident signal being 0 dBm, the deviation of the carrier has been significant (locking range: approximately 50 MHz) and the passband of the demodulated signal may also increase to 50 MHz. The linearity of the demodulation, which depends on the operating point of the transistor 10 and on the choice of the feedback elements in particular, can be better than 1%. These results have here been obtained using as the active element, a dual-gate field-effect transistor of the type BF 905 in the catalog of Texas Instruments or BF 966 in the catalog of RTC, while the other elements had the following preferred values: $V_{G_2}=4$ Volts, $V_D=12$ Volts resistor $20=200$ ohm, resistor $25=680$ Ohm, the capacitance of the variable capacitor 45 varying from 2 to 10 microfarads; the diode 40 is of the type OF 555 of the catalog of RTC, and the inductance 15 is provided by a printed conductor having a length of approximately 3 cm.

Figure 2B:
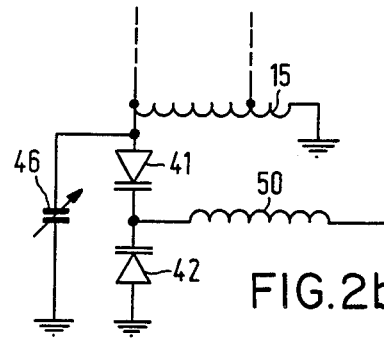
FIGS. 2a to 2c show three variations of the embodiment of the tuning circuit of the oscillator in this loop.
Figure 2A:
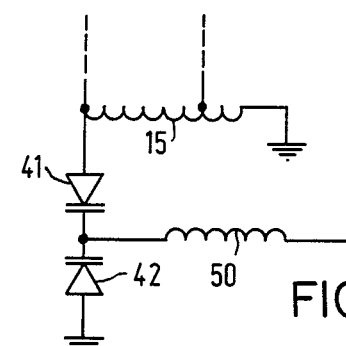
Figure 2C:
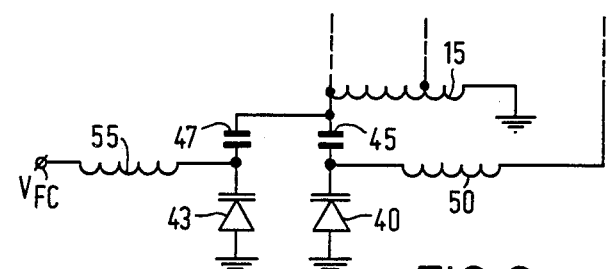

Obviously, the present invention is not limited to the embodiment described above by way of example, alternative embodiments can be proposed without departing from the scope of the invention. The novel, proposed structure can also be used at other frequencies and also in all the conventional or possible uses of phase-locked loops such as carrier recovery in the case of amplitude modulation, locking on a harmonic or a sub-harmonic, phase modulation by superpositioning a modulating signal on the voltage of the drain (the carrier being injected at the gate G₂), etc. Moreover, as described above, the tuning circuit of the oscillator comprises the diode 40 and the capacitor 45, but it may alternatively be of a different composition: it may be formed of two varicap diodes 41 and 42 as in FIG. 2a, or these two diodes and a capacitor 46 arranged in parallel with them as shown in FIG. 2b (the anodes of the diodes being connected to G₁ and to ground), or further, as shown in FIG. 2c, it may be formed by a circuit for controlling the central operating frequency, arranged in parallel with the tuning circuit and also comprising a capacitor 47 and a diode 43, whose common terminal is connected to an inductance 55 which is connected to a biasing voltage $V_{FC}$.

What is claimed is:

1. A phase-locked loop, characterized in that the loop comprises an oscillator of the Hartley type, having a dual-gate field effect transistor, whose gates constitute the phase-comparison inputs and whose drain is coupled to the input of a feedback circuit, which feedback circuit is connected to a tuning circuit of the oscillator.

2. A device as claimed in claim 1, characterized in that the tuning circuit comprises at least a varicap diode and a control capacitor.

3. A device as claimed in claim 1 characterized in that it comprises a circuit for controlling the central operating frequency, arranged in parallel with the tuning circuit.

4. A device as claimed in claim 2, characterized in that it comprises a circuit for controlling the central operating frequency, arranged in parallel with the tuning circuit.

5. A phase-locked loop for demodulating frequency modulated signals, having a Hartley-type oscillator and a feedback circuit, said oscillator including a dual-gate field effect transistor and a tuning circuit coupled thereto, in which the gates of said transistor constitute phase-comparison inputs and a drain thereof is coupled to said feedback circuit, said feedback circuit being coupled to said tuning circuit, characterized in that said frequency-modulated signal is applied to one of said gates and the other of said gates is coupled to said tuning circuit for receiving an oscillator signal therefrom, said drain being coupled to an output of said phase-locked loop for providing the demodulated signals.

6. A device as claimed in claim 5, characterized in that it comprises a circuit for controlling the central operating frequency, arranged in parallel with the tuning circuit.

* * * * *